United States Patent

Nguyen

[19]

[11] Patent Number: 5,814,186
[45] Date of Patent: Sep. 29, 1998

[54] SOG ETCHANT GAS AND METHOD FOR USING SAME

[75] Inventor: Thien T. Nguyen, Austin, Tex.

[73] Assignee: Advanced Micro Devices, Inc., Sunnyvale, Calif.

[21] Appl. No.: 699,211

[22] Filed: Aug. 19, 1996

Related U.S. Application Data

[62] Division of Ser. No. 520,311, Aug. 28, 1995, abandoned.

[51] Int. Cl.⁶ .............................................. H01L 21/3065
[52] U.S. Cl. ................................ 156/643.1; 156/646.1; 156/657.1; 437/228; 437/195
[58] Field of Search ............................. 156/643.1, 646.1, 156/657.1; 437/228, 195

[56] References Cited

U.S. PATENT DOCUMENTS

| | | | |
|---|---|---|---|
| 4,326,911 | 4/1982 | Howard et al. | 252/79.1 |
| 4,952,274 | 8/1990 | Abraham | 156/643.1 |
| 5,021,121 | 6/1991 | Groechel et al. | 156/643.1 |
| 5,171,401 | 12/1992 | Roselle | 156/646.1 |
| 5,219,793 | 6/1993 | Cooper et al. | 216/48 |
| 5,242,538 | 9/1993 | Hamrah et al. | 252/79.1 |
| 5,254,494 | 10/1993 | Van Der Plas et al. | 437/70 |
| 5,316,980 | 5/1994 | Takeshiro | 437/228 |
| 5,399,527 | 3/1995 | Tabara | 437/194 |
| 5,401,998 | 3/1995 | Chiu et al. | 257/368 |
| 5,461,010 | 10/1995 | Chen et al. | 437/228 |
| 5,472,829 | 12/1995 | Ogawa | 430/325 |
| 5,529,948 | 6/1996 | Lur et al. | 437/70 |
| 5,534,731 | 7/1996 | Cheung | 257/759 |
| 5,571,751 | 11/1996 | Chung | 437/187 |

FOREIGN PATENT DOCUMENTS

| | | | |
|---|---|---|---|
| 2240923 | 9/1990 | Japan | 156/646.1 |
| 5129247 | 5/1993 | Japan | 156/646.1 |

OTHER PUBLICATIONS

Wolf, "Silicon Processing for the VLSI Era Process Integration", p. 198, 1990.

*Primary Examiner*—R. Bruce Breneman
*Assistant Examiner*—Michael E. Adjodha
*Attorney, Agent, or Firm*—Kevin L. Daffer; Conley Rose & Tayon

[57] ABSTRACT

An etchant gas and process for using the etchant gas is provided for removing a spin-on glass (SOG) material. The gas composition is chosen as a combination of $CHF_3$, $O_2$ and Ar inserted into a parallel electrode reactor. The reactor pressure is maintained between 755 to 845 mTorr while the rf power is maintained at approximately 400 watts. $CHF_3$ flow rate is optimally chosen between 55 and 65 sccm, with $O_2$ flow rate approximately equal to 15 sccm and Ar flow rate approximately equal to 266 sccm. The processing parameters are optimally chosen to remove SOG at a rate exceeding 1.5 times the rate in which underlying TEOS-based oxide is removed. Accordingly, the present gas composition and processing methodology ensures SOG is completely removed in thicker areas overlying sparsely spaced interconnect, and that underlying oxide is not removed beneath thinner SOG residing above densely spaced interconnect. The process sequence is chosen having a single etch step, with substantial improvements in SOG etch rate so as to improve wafer throughput.

8 Claims, 7 Drawing Sheets

SER ———
SUNIF ‑ ‑ ‑ ‑
TER ·········
TUNIF —·—·—

SOG ETCHANT GAS AND METHOD FOR USING SAME

This application is a division of application Ser. No. 08/520,311, filed Aug. 28, 1995, now abandoned.

BACKGROUND OF THE INVENTION

1. Field of the Invention

This invention relates to integrated circuit manufacture and more particularly to a gas composition and methodology for selectively etching a film of silicate, often referred to as spin-on glass ("SOG").

2. Description of the Relevant Art

In recent years, a trend has been toward producing more densely patterned integrated circuits. Density in large part is limited by the available silicon area. Accordingly, modern integrated circuits are fabricated not only in two dimensions across the silicon substrate, but also in a third dimension perpendicular to the substrate. There may then be several layers formed perpendicular to the substrate, some of which are interconnect layers (or interconnect levels). High density VLSI circuits often require numerous levels of interconnect spaced in the third dimension to complete the circuit path of devices formed within or above the silicon substrate. Multilevel interconnect, while enhancing integrated circuit density, nonetheless presents numerous fabrication problems.

Planarization, is only one problem contributable to multilevel interconnect. It is important, when photolithography printing interconnect trace elements, that the trace element be formed on a relatively planar (i.e., elevationally uniform) dielectric underlayer. The dielectric underlayer, often referred to as "interlevel dielectric", must be made from a composition which is both conformal and variable in thickness depending upon the underlayer topography. More specifically, the interlevel dielectric must be able to flow into recess (or valley) areas such that the resulting dielectric thickness is greater in the recesses relative to the non-recess (or hill areas.

Interlevel dielectrics serve to planarize and provide good uniformity to the next layer of interconnect. Proper composition of the interlevel dielectric ensures good step coverage for overlying interconnect, thereby enhancing overall integrated circuit reliability.

Chemical vapor deposition (CVD) of tetraethoxysilane (TEOS) is a popular form of interconnect dielectric. CVD TEOS, however, while quite conformal to the underlayer, cannot alone fill or planarize to present an elevationally uniform, or planar, upper dielectric surface. In an effort to enhance planarization while maintaining the conformal nature of CVD TEOS, most manufactures have added a spin-on glass (SOG) material to the CVD TEOS. The SOG material, often called organic silicate is spin applied as a liquid across the underlying CVD TEOS. The liquid form SOG can either be an alkoxysilane or tetraethoxysilane (TEOS) placed in a solvent. After it is spin deposited across the wafer, the SOG film is heated to convert the liquid based material to a silica film.

CVD TEOS is classified as silicon dioxide (or "oxide"), and SOG is an oxide-like material. Both CVD TEOS and SOG have dielectric properties necessary to electrically isolate vertically spaced levels of interconnect. The interconnect material includes any type of electrically conductive material formed from thin film deposition and thereafter photolithography patterned. The thin film material includes doped polysilicon or refractory metal, wherein the polysilicon and metal layers can be locally enhanced with various polycide and silicide structures, respectively.

While SOG layers can produce a more elevationally uniform (or planar) upper surface upon which the next interconnect is deposited, SOG cannot fully planarize all surfaces. For example, SOG placed across large diameter wafers, such as 8-inch wafers, unfortunately produces thicker SOG on sparsely spaced TEOS-covered interconnect relative to the SOG thickness on densely spaced TEOS-covered interconnect. Spin momentum and centrifugal force disparity across larger wafers adds to the non-uniformity problems. The application angles of the exposed TEOS in densely spaced interconnects enhances SOG flow to the valleys between the densely spaced interconnects leaving lessor amounts of SOG directly over each interconnect. Conversely, large area interconnect structures, or sparsely spaced interconnect, collect more SOG directly over those areas relative to densely spaced, smaller area interconnects. Bonding pads are but one example of large area interconnect structures which are laterally spaced a somewhat large distance from other interconnect. As defined herein, densely spaced and sparsely spaced interconnect refers to the lateral spacing between interconnects lithography formed from a single layer of conductive film. Accordingly, densely and sparsely spaced interconnect refer to relative levels of lateral spacing.

It is important when using SOG, that portions of the SOG be removed in certain areas. A technique called SOG etchback has been used to remove SOG directly over interconnect contact regions. Contact regions are known in the art as those regions in which a portion of a first level interconnect (or substrate) is connected through a via to a portion of a second level interconnect. The contact is formed through the interlevel dielectric material interposed between the conductive interconnects, or between the substrate and interconnect. It is important to remove all the SOG in and immediately adjacent the contact via. If SOG remains in the contact areas, the SOG can produce "poisoned-via" problems. Even after SOG is cured, moisture and solvent still remain which can outgas to the adjacent vias if left in or around contact areas. The SOG etch-back process is thereby needed to prevent contaminating (or poisoning) the via with the outgassed SOG. Etchback is needed to ensure that SOG remains only in the troughs or valleys between substantially co-planar interconnects. Unfortunately, if SOG over a sparsely spaced (larger area) interconnect is thicker than SOG over a densely spaced (smaller area) interconnect, then the present SOG etchback processes cannot ensure that SOG will be removed entirely over thicker SOG areas. Further, if etch time is increased to allow full removal of thick SOG overlying large area, sparsely patterned interconnect, the etchant composition will unduly remove underlying CVD TEOS directly above densely spaced interconnect. It is thereby desirable that an SOG etch-back technique be derived that is (i) highly selective to removal of SOG as opposed to underlying CVD TEOS, and (ii) there be a high degree of uniformity at which SOG is removed across the entire wafer surface of large diameter wafers.

SUMMARY OF THE INVENTION

The problems outlined above are in large part solved by an improved SOG etchant gas and technique for use thereof. In particular, an SOG etchant gas is selected which removes SOG siloxanes (or TEOS) at a rate exceeding 1.5 times the etch rate of underlying CVD TEOS oxide. An SOG:oxide selectivity exceeding 1.5:1 allows full removal of thicker SOG residing above large area, sparsely spaced interconnect while preventing deleterious removal of CVD TEOS overlying small area, densely spaced interconnect. Substantially retaining the TEOS-based oxide in the contact regions ensures good dielectric separation of vertically spaced, non-connected interconnect.

The present SOG etchant gas is chosen as a mixture of $CHF_3$, $O_2$ and Ar. The present gas composition not only achieves the aforesaid selectivity benefit, but also removes SOG at a substantially uniform rate at various points existing across the entire wafer surface. The SOG film of an SOG-coated wafer equal to or exceeding 8-inches in diameter is removed at a fairly high etch rate exceeding 3500 angstroms per minute across the entire wafer surface with uniformity of the remaining SOG thickness relative to the uniformity of the initial SOG thickness across that entire surface being less than 3.0% variance. High uniformity ensures SOG over densely and sparsely spaced interconnect is removed at an even rate regardless of the location upon the wafer being etched.

Utilizing a parallel electrode, single wafer (non-batch) reaction chamber pressurized at 800 mTorr at 400 watt rf power, the present SOG etchant gas achieves high SOG:oxide selectivity and high SOG uniformity using a single etchant step. That is, SOG etch can be performed in a single main etch step, as opposed to a main etch and over etch step conventionally used with most parallel electrode, plasma etch techniques. More specifically, the single etch step occurs with rapid SOG removal with sufficient carbon polymer protectant to enhance selectivity. Carbon polymer is removed during the single etch step without having to undertake a separate over etch step to clean and remove polymer resulting from a conventional main etch step.

Broadly speaking, the present invention contemplates a gas for selectively etching spin-on glass (SOG). The gas comprises a composition consisting of C, H, F, O and Ar atoms species. The gas is a mixture of $CHF_3$, $O_2$, and Ar applied in a single step with no other SOG etch steps prior to and after the single step.

The present invention further contemplates a method for selectively etching portions of the semiconductor wafer. The method includes chemical vapor depositing a film of oxide upon a wafer topography comprising densely spaced and sparsely spaced interconnect (i.e., metal trace elements). A silicate material is then spin deposited upon the oxide film. The silicate material thickness is greater over metal trace elements which are sparsely spaced compared to metal trace elements which are densely spaced. Silicate is then removed in a single etch step at a etch rate greater than 1.5 times faster than underlying oxide removal. The remaining oxide film overlying trace elements which are densely spaced is less than 3% thinner than the oxide film overlying the trace elements which are sparsely spaced.

BRIEF DESCRIPTION OF THE DRAWINGS

Other objects and advantages of the invention will become apparent upon reading the following detailed description and upon reference to the accompanying drawings in which.

Figure 1:
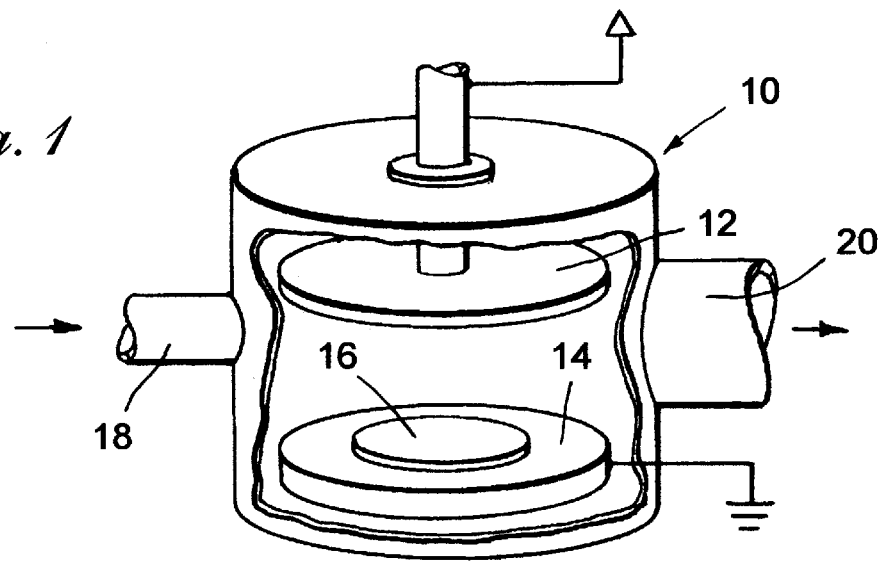
FIG. 1 is an isometric view in partial breakaway of a parallel reactor configured in a plasma etch mode for use by the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates in isometric view a parallel electrode reactor 10 having rf power applied to upper electrode 12 and ground applied to lower electrode 14. Wafer 16 is placed upon lower electrode 14. Wafer 16 includes an upper topological surface upon which a plurality of layers are formed. The upper surface is exposed to a plasma reaction within reactor 10, between electrodes 12 and 14. Reaction occurs by forwarding a mixture of gas into port 18 during times in which an ion-direct field is applied between electrodes 12 and 14. Completion of reaction is determined by various end point detection techniques such as, for example, optical emission spectroscopy or mass spectroscopy. After reaction is complete, power is terminated and gasses are expelled from port 20. Plasma etching and end point detection are well known to the skilled artisan.

The etch routine generally includes many steps, of which only a single step is used to physically remove an SOG layer upon wafer 16. Reactor 10 includes any parallel electrode reactor, a suitable reactor can be obtained from Lam Research Corporation, Model No. Rainbow 4528. The reaction process generally begins with a first stabilization step, whereby ambient within the reactor is stabilized without power applied to electrodes 12 and 14. A second pre-stabilization step may also be used, whereby wafer 16 is clamped to electrode 14 to ensure electrical connectivity therebetween. After the first or second pre-stabilize steps, an etch step is used to physically remove various thin films, including SOG from wafer 16. The etch step hereof utilizes a single step of which pressure within reactor 10 is maintained at approximately 800 mTorr, rf power is maintained at 400 watts and inlet port 18 receives a mixture of $CHF_3$, $O_2$ and Ar. Inlet gases of $CHF_3$, $O_2$, and Ar are maintained throughout the etch step at approximately 60 sccm, 15 sccm, and 266 sccm, respectively. After a time period has elapsed sufficient to remove SOG in areas directly above TEOS-covered interconnect, the etch step is concluded with removal of power from electrodes 12 and 14. Thereafter, a post-stabilization step is used for a time period necessary to expel reaction byproducts from chamber 10 via outlet port 20. Depending upon the nature of byproducts and particulate matter arising from the etch step, more than one post-stabilization, removal/flush steps may be needed. Regardless of the number of pre- and post-stabilization steps needed, a single etch step occurs in which rf power is applied and etchant gas quantities are introduced.

Figure 2:
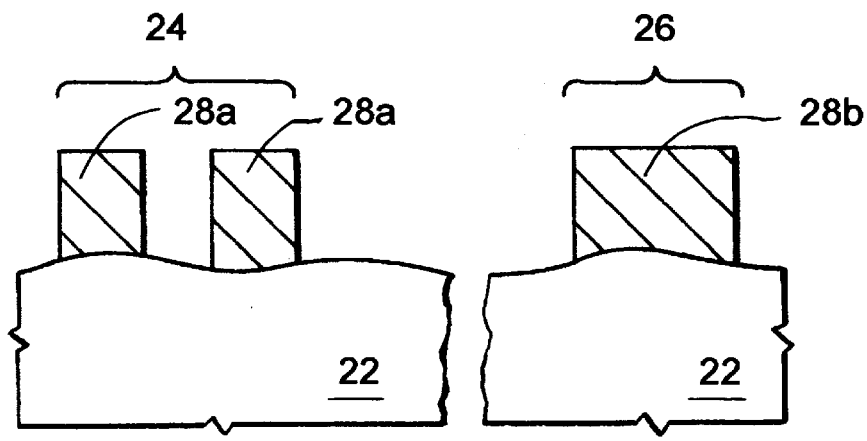
FIGS. 2–6 are cross-sectional views a partial semiconductor wafer topography having SOG deposited over oxide, wherein SOG is selectively and uniformly removed over densely and sparsely spaced interconnect areas according to the present invention.

Referring to FIGS. 2–6, cross-sectional views of a partial semiconductor topography undergoing a sequence of steps using reactor 10 are shown. FIG. 2 illustrates an interconnect level, e.g., a patterned metal layer, formed upon either a silicon substrate or, upon an interlevel dielectric 22. The interconnect comprises densely patterned trace elements 24 and sparsely patterned trace elements 26. It is understood that sparsely spaced area 26 includes numerous interconnects spaced further apart than the interconnects within densely spaced area 24. Further, interconnects within area 26 can be larger in lateral dimension than interconnects within area 24. Interconnects within densely spaced region 24 are denoted with reference numeral 28a, and interconnects within sparsely spaced region 26 are denoted with reference numeral 28b.

According to one embodiment, interconnects 28 are formed from several adjoined layers of metalized material which are subsequently removed in a single selective removal process. The metalized layers includes, for example, a bottom layer of titanium, a titanium nitride layer above the titanium layer, an aluminum layer above the titanium nitride layer, and a titanium nitride layer above the aluminum layer. The combined TiN/Al/TiN/Ti as an overall metal structure includes desirable conductive properties with ohmic contact enhancements made at the upper and lower surfaces of the structure. The TiN/Al/TiN/Ti structure, according to one example, includes 1100 Angstrom TiN, 4,000 Angstrom of Al with 1% copper, 350 Angstrom TiN and 250 Angstrom Ti. According to another example, the metalized layers include a TiN/Al/Ti structure, having between 350 to 1100 Angstroms TiN, 8000 Angstroms of Al with 1% copper and 250 Angstroms Ti.

Figure 3:
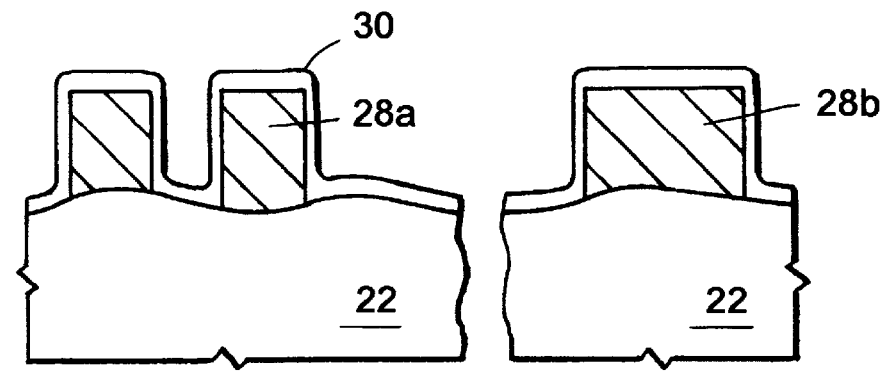

Turning now to FIG. 3, a processing step subsequent to FIG. 2 is shown. Namely, an oxide derived from TEOS and chemical vapor deposited (CVD) across the entire topography, including areas 22 and 28, is shown. The oxide film is denoted with reference numeral 30 having a highly conformal characteristic on the upper and lateral surfaces of interconnect 28. Importantly, oxide 30 is derived from a plasma enhanced CVD (PECVD) chamber, an advantage being that oxide 30 coats the exposed surface upon and between interconnect 20 having high aspect ratios (interconnect layer 20 thickness relative to spacing therebetween). Preferably, oxide 30 is deposited to a thickness of approximately 2,000 angstroms directly upon interconnect 28, and in the range between 1,000 angstroms and 2,000 angstroms at the sides of interconnect 28.

Figure 4:
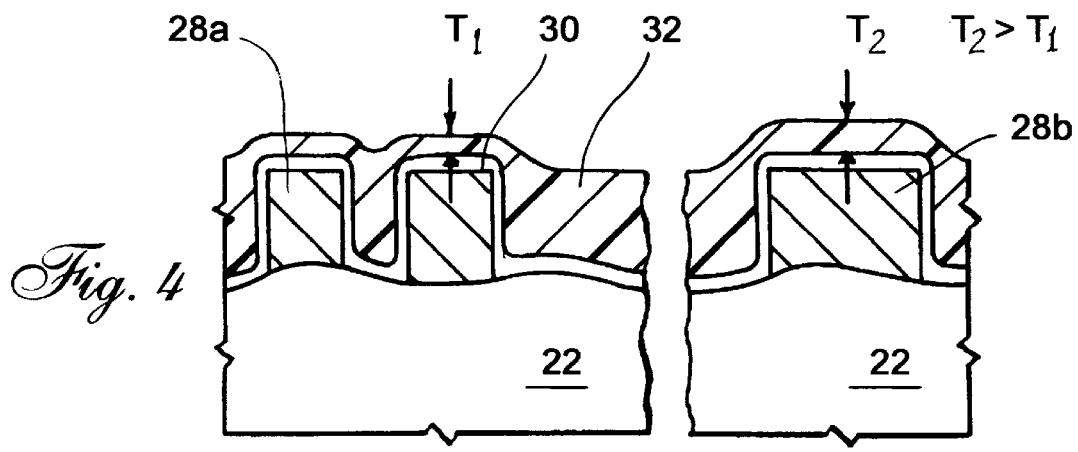

FIG. 4 illustrates a processing step subsequent to FIG. 3. Namely, FIG. 4 depicts spin-on deposited organic silicate layer 32. Layer 32 is deposited according to spin-on techniques, and comprises a spin-on glass (SOG) preferably derived from a TEOS source within an alcohol-based solvent. A suitable SOG is obtained from Allied Signal, Inc., part no. 314. Due to the nature of spin-on properties and flow propensity, SOG naturally thins in areas overlying CVD TEOS-covered small interconnects relative to CVD TEOS-covered large interconnects. Further, SOG thickness is lessened above interconnects which are densely patterned relative to interconnects which are sparsely patterned. FIG. 4 illustrates a thinner region $T_1$ relative to $T_2$. The phenomenon of SOG thickness variability presents a problem unless SOG etch techniques of the present invention are used.

Figure 5:
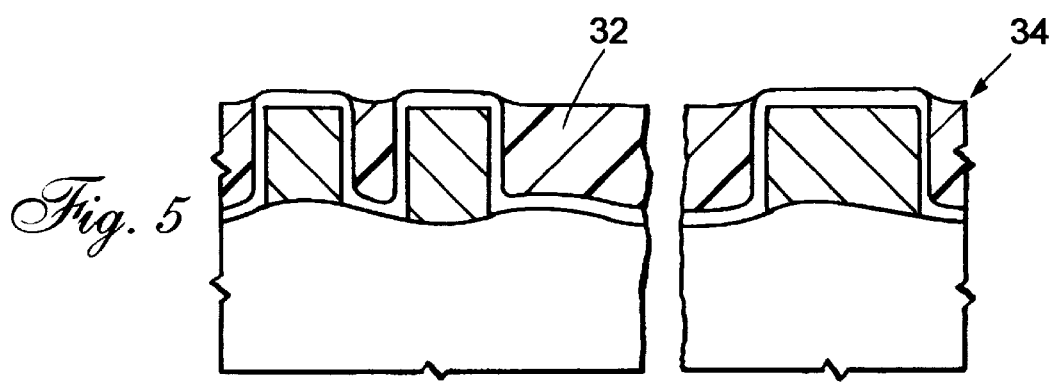
Figure 6:
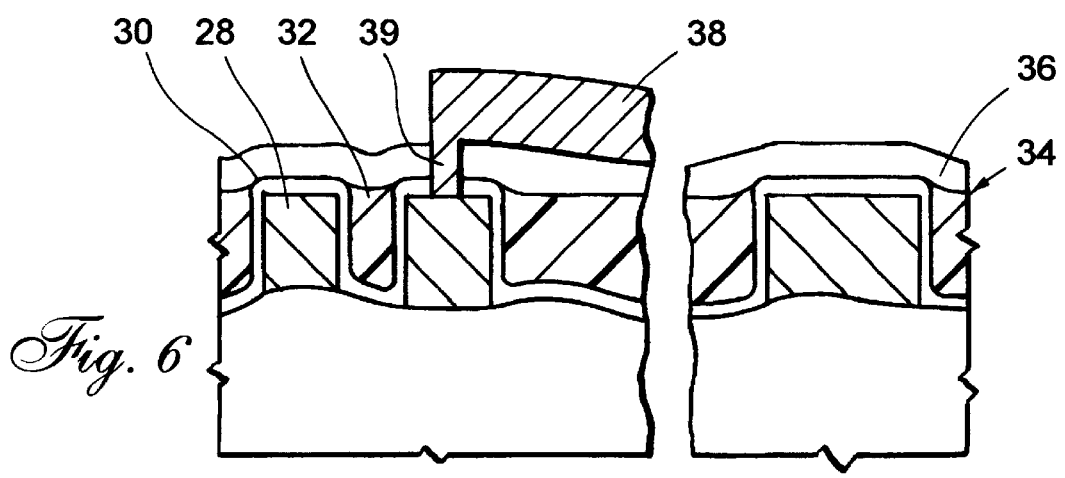

Turning now to FIG. 5, a process steps subsequent to FIG. 4 is shown. FIG. 5 depicts SOG etch back, wherein SOG layer 32 is entirely removed in both areas $T_1$ and $T_2$. The unique etchant chemistry, in combination with flow rates and reactor configuration, ensures region $T_2$ is entirely removed and that oxide 30 underneath region $T_1$ remains substantially intact. Complete removal of SOG is necessary to prevent poisoned via problems. The remaining upper surface 34 is substantially planar, with marked improvements in the elevation uniformity of surface 34. Surface 34 is shown in FIG. 6 with various other dielectric and metal layers thereover deposited. Dielectric and metal/interconnect layers of a subsequent level are denoted in FIG. 6 as reference numerals 36 and 38, respectively. FIG. 6 thereby indicates two levels of interconnect 28 and 38. Interconnect 28 is coupled to interconnect 38 by a via 39.

Figure 7:
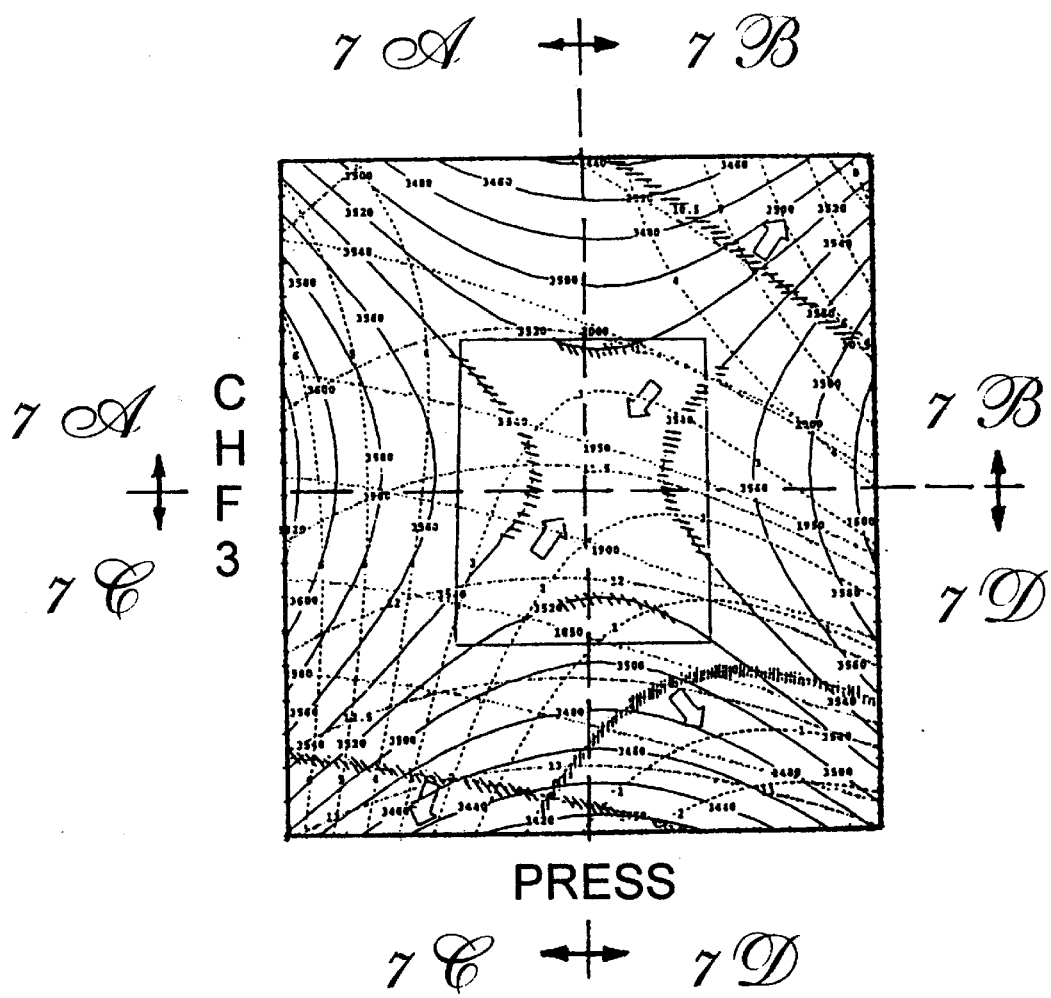
FIG. 7 is a contour plot of SOG and oxide, defined in terms of etch rate and uniformity as a function of $CHF_3$ flow rate and plasma etch reactor pressure.
Figure 7A:
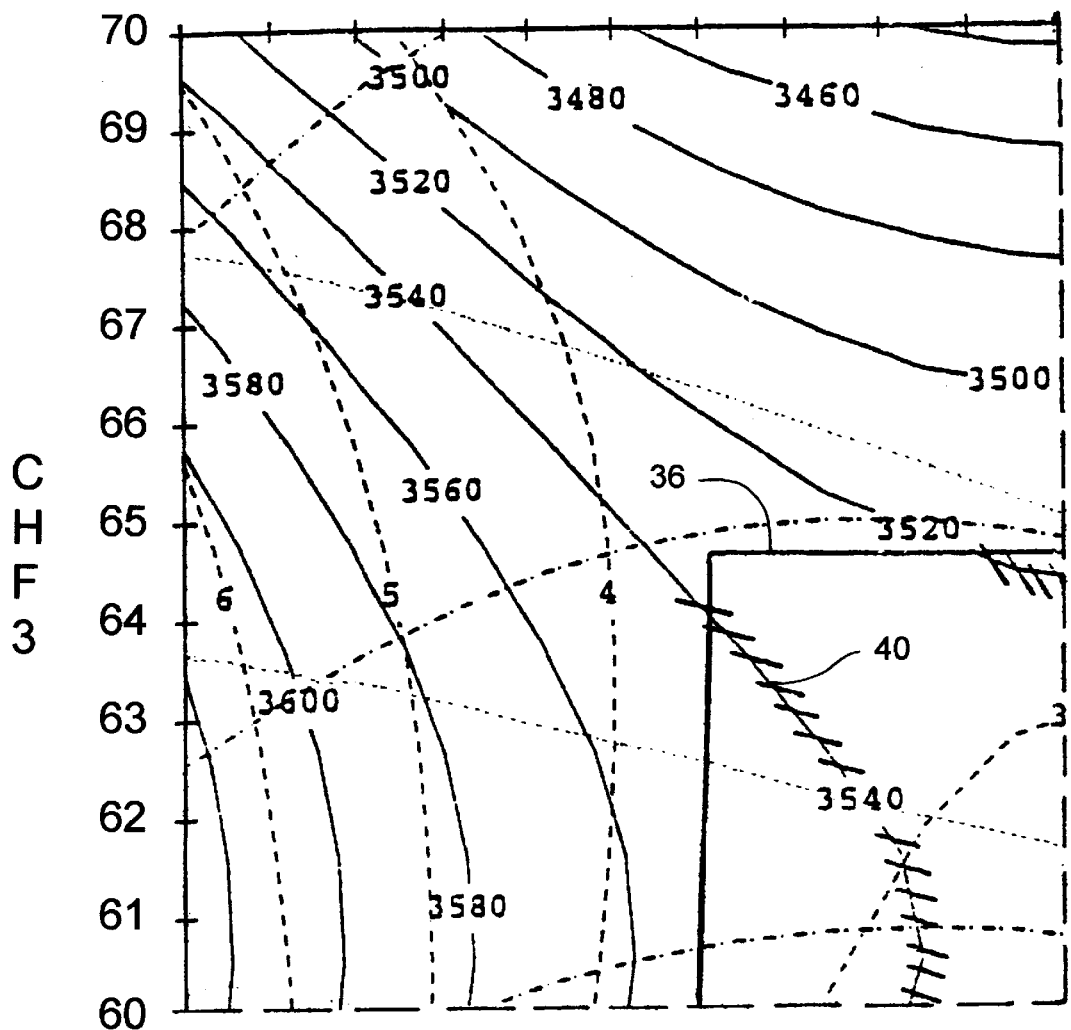
Figure 7:
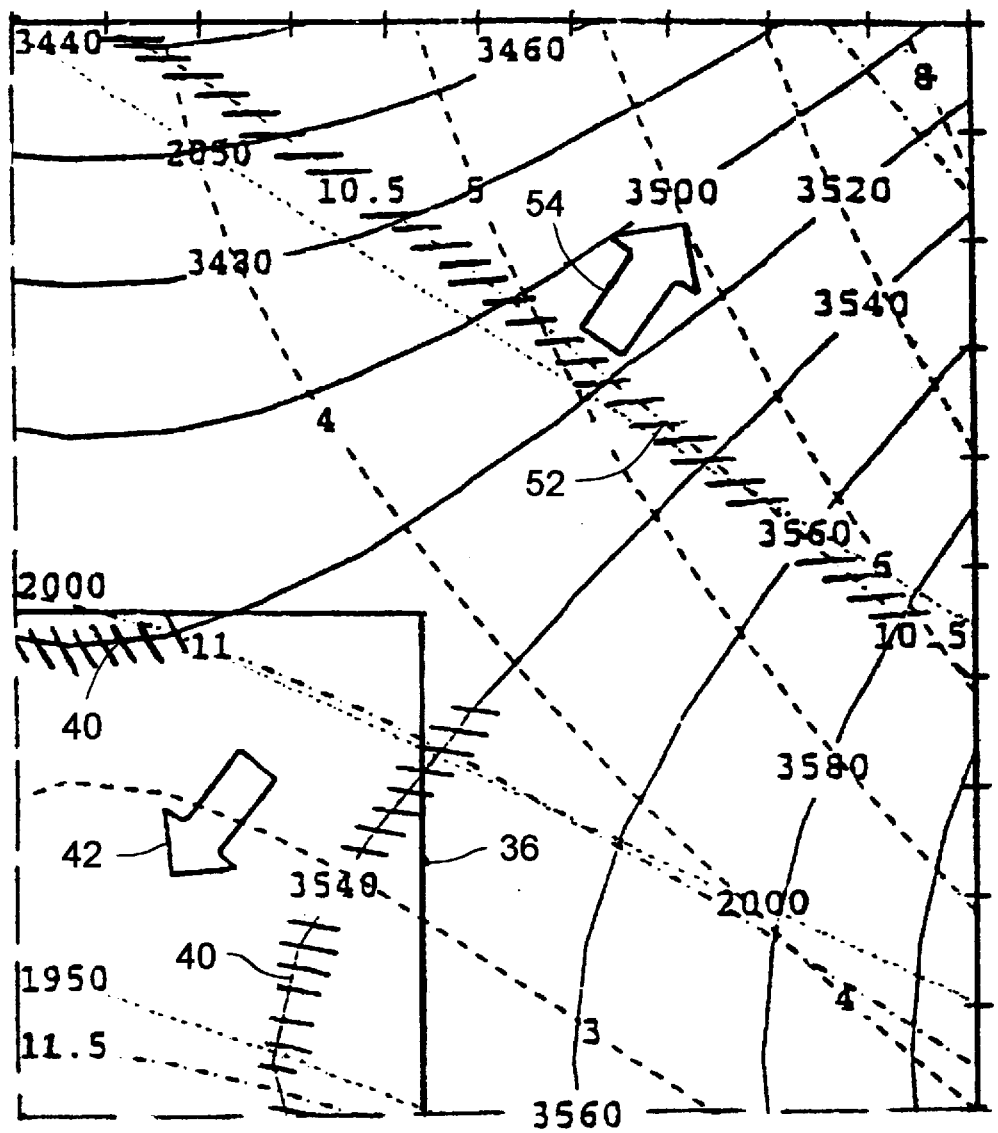
Figure 7C:
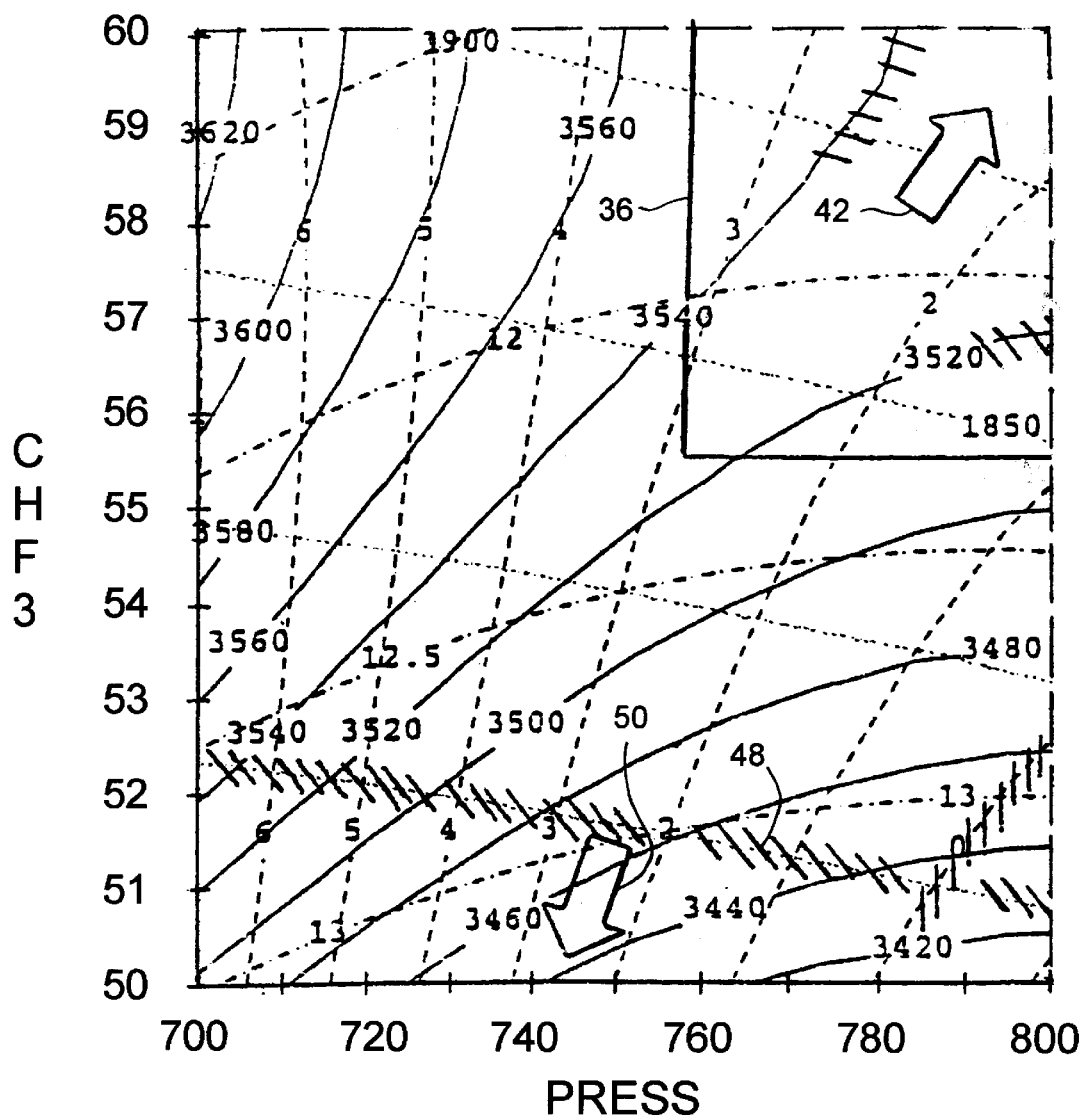
Figure 7D:
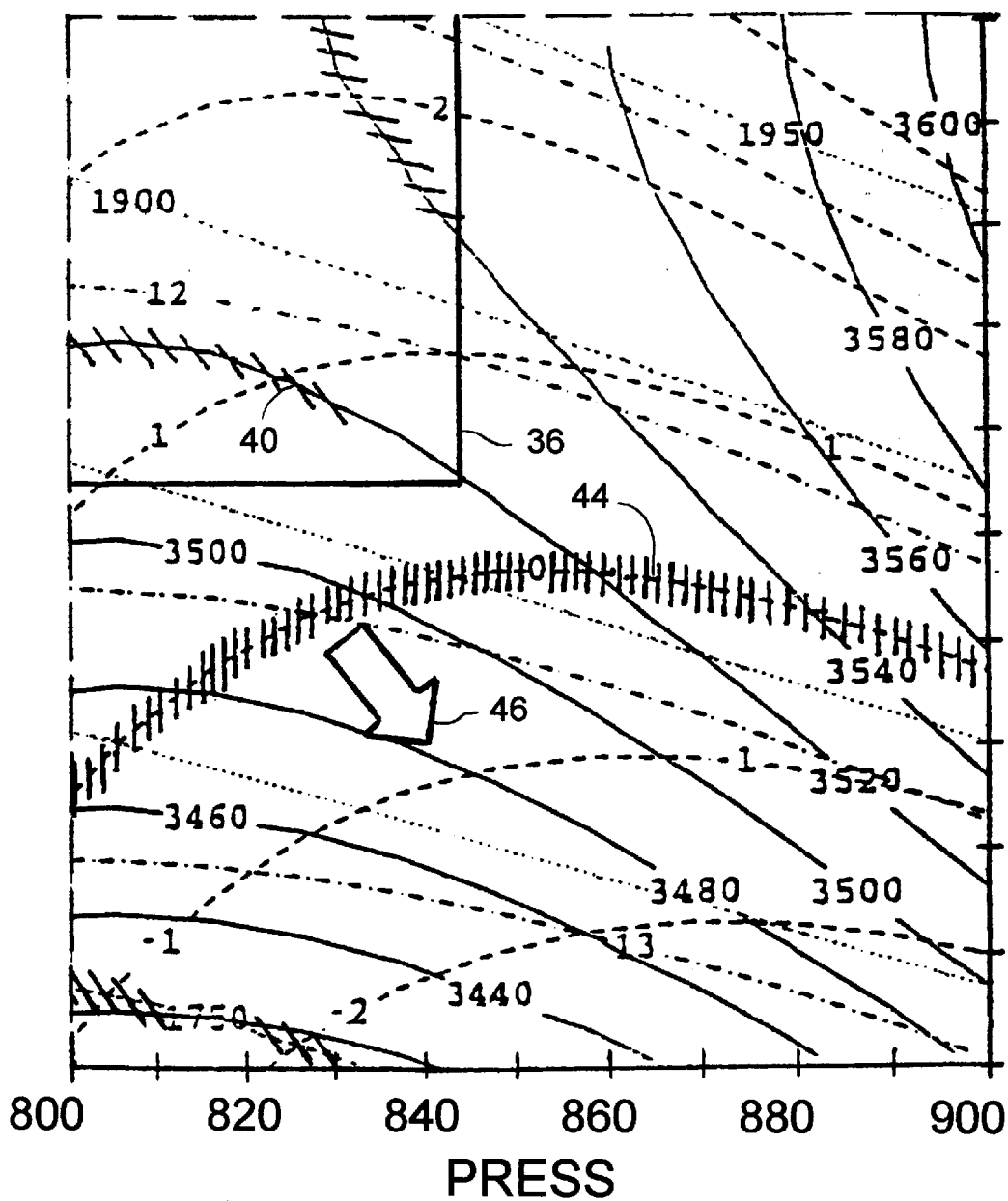

Turning now to FIG. 7, a contour plot is shown of SOG and oxide defined in terms of etch rate and uniformity. Etch rate and uniformity are plotted as a function of $CHF_3$ flow rate (y-axis) and reactor pressure (x-axis). A solid line depicts SOG etch rate (denoted as "SER"). A dashed line depicts SOG uniformity (denoted as "SUNIF") A dotted line illustrates TEOS oxide etch rate (denoted as "TER"). A interspersed dashed and dotted line illustrates TEOS oxide uniformity (denoted as "TUNIF"). A desirable contour plot for SOG removal rate is marked with hatchings and shown with reference numeral 40. Arrows 42 indicate the direction by which SOG etch rate can be increased. A desirable SOG uniformity is marked with hatchings and depicted with referenced numeral 44, with arrow 46 indicating an increase in SOG uniformity. Reference numeral 48 indicates a desirable TEOS oxide etch rate, which is marked with hatchings, with arrow 50 indicating a decrease in oxide etch rate. Reference numeral 52 indicates a desirable TEOS oxide uniformity, which is marked with hatchings, with arrow 54 depicting an increase in oxide uniformity.

As can be seen from various curves 40, 44, 48 and 52 of FIG. 7, given a $O_2$ flow rate of 15 sccm with rf power of 400 watts, and argon flow of 256 sccm, optimal $CHF_3$ flow rate and optimal reactor pressure can be derived. $CHF_3$ flow rate and pressure are dependent upon each other and optimal amounts are experimentally derived by the present inventors, based upon the contour plot of FIG. 7. Namely, a trade-off exists between etch rate and uniformity for both SOG and TEOS. Highest SOG etch rate and highest SOG and TEOS uniformity are desired with lowest TEOS oxide rate. The desired region is therefore taken within the constraints of arrows 42, and is a compromise between arrows 46, 50 and 54. The optimal region is defined as that denoted with reference numeral 56. Accordingly, it is through experimentation confirmed with SEM, FTIR and XPS measurements, the present inventor has derived an optimal $CHF_3$ flow rate of 60 sccm, and an optimal pressure of 800 mTorr. Window 56 indicates a repeatable recipe (and/or specification) by which $CHF_3$ can vary from approximately 55.5 to 64.5 sccm, and pressure can vary between approximately 755 to 845 mTorr. Provided pressure and $CHF_3$ flow rate is defined within the rather large window of 56, and provided the aforesaid parameters of $O_2$ and Ar as well as reactor power are maintained throughout the etch rate, optimal SOG selectivity and uniformity can be repeatedly achieved by the present process.

It will be appreciated to those skilled in the art having the benefit of this disclosure that this invention is believed to be capable of removing a TEOS-based SOG layer with high selectivity to underlying TEOS-based oxide, resulting in a more uniform removal of SOG across the entire wafer dimension, regardless of the size of the wafer. $CHF_3$ is used to enhance selectivity of SOG removal at a rate exceeding 1.5 times the underlying oxide removal rate. $CHF_3$, in combination with $O_2$ enhances SOG removal rates while preventing accumulation of undesirable polymers at the removal site. Large SOG removal rates are provided in combination with sufficient clean-up of removed residue so as to achieve etch within a single step, without having to change etch chemistry or change etch reactor parameters. Use of a single step substantially improves wafer throughput.

By defining a $CHF_3$ flow window and reactor pressure window, such as that shown in FIG. 7, the present process can be easily repeated as a high volume, manufacturable etch process. Slight variations in $O_2$ and Ar can also be tolerated, providing $O_2$ is present to enhance SOG etch rate, and provided Ar is present to carry or disseminate $CHF_3$ and $O_2$ gasses entirely throughout the reaction chamber across a large wafer surface. Ar is advantageously used to disseminate in a uniform manner the etch gas across large surface areas such as an 8-inch wafer.

It is to be understood that the form of the invention shown and described is to be taken merely as presently preferred examples of how a one-step etch cycle is used to remove a TEOS-based SOG layer in densely spaced and sparsely spaced interconnect regions. Various modifications and changes may be made to the above processing parameters without departing from the spirit and scope of the invention as set forth in the claims. It is intended that the following claims be interpreted to embrace all such modifications and changes and, accordingly, the specification and drawings are to be regarded in an illustrated rather than a restrictive sense.

What is claimed is:

1. A semiconductor etch process comprising:

providing a semiconductor wafer topography, wherein said semiconductor wafer topography comprises a semiconductor substrate and a patterned metal layer on said substrate, said patterned metal layer comprising densely patterned trace elements and sparsely patterned trace elements;

depositing an oxide layer upon said semiconductor wafer topography;

spin depositing a silicate material upon said oxide layer, wherein a first thickness of said silicate material over said densely patterned trace elements is less than a second thickness of said silicate material over said sparsely patterned trace elements; and performing a single step etch of said silicate material in a plasma etch reactor chamber with an etchant comprising $CHF_3$, $O_2$, and Ar with approximate flow rates of 60 sccm, 15 sccm, and 266 sccm, respectively, wherein said etchant etches said silicate material at a rate approximately 1.5 times the rate at which said etchant etches said oxide layer such that there is less than a 3.0% variance in the uniformity of the remaining SOG thickness relative to the uniformity of the initial SOG thickness across the entire semiconductor wafer topography.

2. The process of claim 1, wherein the step of depositing said oxide layer comprises depositing oxide formed from a TEOS source.

3. The process of claim 1, wherein said silicate material comprises spin-on glass material.

4. The process of claim 1 wherein said etchant is maintained at a pressure of approximately 755 to 845 millitorrs.

5. A semiconductor etch process comprising:

providing a semiconductor topography;

forming an oxide layer upon said semiconductor topography;

forming a variable thickness organic silicate layer upon said oxide layer; and performing a single step etch of said organic silicate layer in a plasma etch chamber reactor, wherein an ambient within said chamber reactor comprises $CHF_3$, $O_2$, and Ar with approximate flow rates of 60 sccm, 15 sccm, and 266 sccm, respectively, such that said organic silicate layer is etched at a rate greater than 1.5 times the rate at which said oxide layer is etched, and such that there is less than a 3.0% variance in the uniformity of the remaining SOG thickness relative to the uniformity of the initial SOG thickness across the entire semiconductor wafer topography.

6. The process of claim 5 wherein said organic silicate layer comprises spin-on glass.

7. The process of claim 5 wherein said oxide layer comprises an oxide layer formed from a TEOS source in a plasma enhanced CVD reactor.

8. The process of claim 5 wherein said semiconductor topography comprises a patterned metal layer upon a semiconductor substrate.

* * * * *